(12) United States Patent
Tajalli et al.

(10) Patent No.: US 8,928,423 B2
(45) Date of Patent: Jan. 6, 2015

(54) NARROW BAND RECEIVER OR TRANSCEIVER

(71) Applicant: EM Microelectronic-Marin S.A., Marin (CH)

(72) Inventors: Armin Tajalli, Chavannes-pres-Renens (CH); Marc Morin, Colorado Springs, CO (US)

(73) Assignee: EM Microelectronic-Marin S.A., Marin (CH)

( * ) Notice: Subject to any disclaimer, the term of this patent is extended or adjusted under 35 U.S.C. 154(b) by 36 days.

(21) Appl. No.: 13/739,366

(22) Filed: Jan. 11, 2013

(65) Prior Publication Data
US 2014/0197894 A1    Jul. 17, 2014

(51) Int. Cl.
*H03B 5/08* (2006.01)
*H03J 1/00* (2006.01)
*H03G 3/30* (2006.01)
*H03L 7/08* (2006.01)

(52) U.S. Cl.
CPC . *H03L 7/08* (2013.01); *H03J 1/005* (2013.01); *H03G 3/3068* (2013.01); *H03G 3/3036* (2013.01); *H03G 3/3042* (2013.01)
USPC ........... 331/167; 331/175; 330/137; 330/302; 330/305; 455/260; 455/340; 455/293

(58) Field of Classification Search
CPC ............ H03F 1/3211; H03F 2200/111; H03F 2200/447; H03F 2200/63; H03F 2203/45264; H03F 2203/45286; H03F 2203/45464; H03F 2203/45544; H03F 2203/45554; H03F 3/195; H03F 3/68; H03G 3/3036; H03G 3/3042
USPC ............ 331/177 V, 16, 177 R, 175; 455/260, 455/264, 139, 245.1, 232.1, 340, 293; 330/137, 305, 302; 327/552
See application file for complete search history.

(56) References Cited

U.S. PATENT DOCUMENTS 7,580,680 B2 *   8/2009   Isaac et al. ................. 455/67.11
2013/0295863 A1 *   11/2013   Shanan ...................... 455/226.2

* cited by examiner

*Primary Examiner* — Arnold Kinkead
(74) *Attorney, Agent, or Firm* — Oblon, Spivak, McClelland, Maier & Neustadt, L.L.P.

(57) ABSTRACT

A narrow band receiver or transceiver for processing electrical signals. The narrow band receiver or transceiver includes an amplifier, a voltage controlled oscillator and a tuning assembly comprising at least one control loop for tuning of the voltage controlled oscillator. At least a gain control of the amplifier is coupled to the control loop for simultaneously tuning the output amplitude of the voltage controlled oscillator and the gain of the amplifier. A compensation of the effect of variation on the gain of the amplifier, which includes an LC tank circuit, is performed by using an information in another LC tank circuit of the voltage controlled oscillator in the control loop.

18 Claims, 2 Drawing Sheets

US 8,928,423 B2

NARROW BAND RECEIVER OR TRANSCEIVER

FIELD OF THE INVENTION

The present invention relates to the field of narrow band receiver or transceiver circuits for receiving or transmitting and processing electrical signals and in particular for receiving or transmitting RF electromagnetic radiation.

BACKGROUND OF THE INVENTION

Receiver circuits for processing RF signals typically comprise some kind of amplifiers, e.g. at least one low-noise amplifier (LNA) to amplify a received signal while adding negligible noise. In particular with narrow band receivers, generally at least one or several LC tank circuits or LC resonator circuits are commonly used to remove noise as well as signals lying outside a frequency band of interest. Moreover, the gain and the center frequency of a low-noise amplifier (LNA) represent two critical parameters regarding the overall design of such amplifiers. Additionally, the gain of the low-noise amplifier (LNA) strongly depends on the voltage supply, the surrounding temperature and is further dependent on intrinsic or inherent individual properties of its electronic components.

Moreover, also the center frequency of a low-noise amplifier (LNA) depends on the concrete value of the capacitor and the inductor of the LC tank circuit. The center frequency therefore changes with temperature and strongly depends on inevitable variations of the manufacturing process. Hence, electronic components of the LC tank, in particular its capacitors and inductors, and the quality factor of the inductor are subject to non-negligible variance. The absolute capacitance of a series of substantially identical capacitors may vary up to 5%, 10% or even more. Moreover, under practical manufacturing conditions also the variance of a series of inductive elements may vary up to 5% regarding their absolute inductance, and the variation of the quality factor of the inductor with temperature, which can change by 10 to 20%.

It is therefore necessary to adjust the center frequency and the voltage gain of each narrow band amplifier or LNA in a narrow band receiver or transceiver individually in order to provide a desired receiver or transceiver performance. However, adjusting voltage gain and center frequency in a narrow band amplifier or LNA circuit is rather challenging and quite costly.

In FIG. 1, a conventional narrow band receiver 1 is illustrated. The receiver 1 comprises an antenna 2 coupled with an impedance matching circuit 3. The output of the impedance matching circuit 3 is provided to an amplifier 4, in particular to a LNA.

The output of the LNA 4 is coupled with a mixer 5. The narrow band receiver 1 also comprises a voltage controlled oscillator 7 coupled with the mixer 5. The output of the mixer 5 is typically provided to a filter and demodulator 6 for further processing the received signals.

Also the voltage controlled oscillator (VCO) requires proper adjustment of its center frequency and of its voltage swing. Therefore, the VCO is provided with a tuning loop 8, which may be implemented for example as a phase locked loop (PLL), and which can include also an amplitude locked loop (ALL) and/or a frequency locked loop (FLL). Said PLL is typically locked and controlled by a reference 9, e.g. comprising a crystal oscillating at a given reference frequency.

Conventional designs for narrow band receiver circuits comprise at least two control loops or mechanisms 10, 8 separately coupled to the amplifier 4 and to the VCO 7. The tuning and adjustment of the amplifier 4 and the VCO 7 therefore has to be typically performed separately. As a consequence, tuning of the amplifier's gain and center frequency is separated from a respective tuning of the VCO. Therefore, respective tuning procedures have to be conducted for the VCO and for the amplifier separately, thus raising tuning efforts and costs.

SUMMARY OF THE INVENTION

It is therefore an object of the present invention to provide an improved narrow band receiver or transceiver featuring and providing a simplified tuning for both, the amplifier and the VCO.

It is a particular aim of the present invention to reduce the number of electronic components of a narrow band receiver or transceiver and to provide a simultaneous, precise and robust tuning of the amplifier and the VCO.

In a first aspect the invention relates to a narrow band receiver or transceiver for processing electrical signals. The narrow band receiver or transceiver comprises at least one amplifier for amplifying received signals or signals to be transmitted, and a voltage controlled oscillator (VCO). In the case of a narrow band receiver, a mixer can be connected to the output of the amplifier and the voltage controlled oscillator to provide down converted signals.

Additionally, a tuning assembly is provided comprising at least one control loop for tuning the center frequency and output amplitude, such as voltage swing of the VCO. Here, at least a gain control of the amplifier is also coupled to the at least one control loop of the VCO for simultaneously tuning of the oscillator's output amplitude and the amplifier's gain. A compensation of the effect of variation on the gain of the amplifier can be obtained by using an information in an LC tank circuit of the voltage controlled oscillator in the control loop.

In this way, a separate control loop for tuning and adjusting the gain of the amplifier is no longer required. Tuning of the amplifier's gain is preferably correlated to the tuning of the VCO's output amplitude, hence to the tuning of the voltage swing of the VCO. The voltage swing of the VCO and the voltage gain of narrow band amplifier or LNA both depend on quality factor of the inductor.

In this way, one and the same tuning assembly can be used for tuning of both, the amplifier and the VCO. Preferably, an existing tuning assembly of a VCO now becomes also operable to tune and to adjust at least the gain of the amplifier. A separate tuning assembly for the amplifier may therefore become superfluous. As a consequence, the number of components of the narrow band receiver or transceiver can be reduced. Moreover, adjusting and tuning of the amplifier's gain can be automatically correlated and linked to the tuning and adjustment of the VCO.

The simultaneous tuning of the voltage swing of a VCO and the gain of the amplifier is based on the observation, that the gain of an amplifier, in particular of a LNA behaves very similar to the voltage swing or output amplitude of a VCO. Typically, the gain of the LNA and the voltage swing of the VCO strongly depend on current consumption and on a quality factor Q of respective LC tank circuits of the amplifier, such as a LNA, and VCO, respectively.

Therefore, a common and shared tuning assembly is implementable, by way of which the amplifier's gain is tunable or adjustable simultaneously with a respective tuning or adjustment of the voltage swing or output amplitude of the VCO.

It is particularly intended, that at least one control loop includes the VCO. Hence, the VCO is a component of the control loop. The at least one control loop of the tuning assembly is therefore particularly and predominately adapted to adjust and to tune the output amplitude of the VCO. Coupling of the amplifier's gain control to the at least one control loop may be implemented without a feedback from the amplifier to the control loop. The tuning signal obtainable by means of the control loop is preferably simply provided to the gain control of the amplifier for tuning the same in accordance with the tuning of the VCO.

In this way, tuning of VCO and the amplifier is closely coupled and inter-related. In particular the LNA can be automatically tuned and calibrated by the at least one control loop, which is based on and includes the VCO.

By means of the simultaneous tuning of the amplifier's gain and of the VCO's output amplitude, the process of tuning of VCO and amplifier can be simplified. Moreover, the tuning of the amplifier's gain can exhibit a high precision.

According to a preferred embodiment the tuning assembly further comprises an amplitude locked loop (ALL) including the voltage controlled oscillator. In VCO, the current is adjusted also to compensate the effect of the quality factor of the inductor on voltage swing, and in LNA the bias current can be adjusted in a similar fashion to compensate the effect of variation of the inductor quality factor on the voltage gain of the amplifier. Furthermore, said ALL is coupled with the amplifier, in particular with the gain control of the amplifier for tuning of the amplifier's gain. By means of the amplitude locked loop implemented with the VCO the current consumption of the VCO can be appropriately tuned and adjusted in order to set a required voltage swing of the VCO. Adjustment of the VCO's current consumption may be implemented by means of voltage controlled current sources or by means of digitally programmable current sources provided in the circuit of the VCO. Preferably, the signal obtained by the amplitude locked loop is provided to the gain control of the amplifier for appropriately tuning the gain of amplifier as well.

In another preferred embodiment the tuning assembly also comprises a frequency locked loop (FLL) including the voltage controlled oscillator. Said frequency locked loop is further coupled with the amplifier for tuning of the amplifier's center frequency. By means of another control loop, hence the FLL, not only the amplifier's gain but also the amplifier's center frequency can be appropriately tuned and adjusted in accordance with a comparable tuning or adjustment procedure of the VCO.

Such a simultaneous tuning and adjustment is obtainable since the frequency behavior of the amplifier, in particular of a LNA and the VCO is mainly governed by capacitance and the inductance of respective capacitive and inductive components of respective LC tank circuits of the VCO and the amplifier, respectively. Since the center frequencies of the amplifier and the VCO exhibit a similar behavior regarding temperature and regarding production tolerances of their individual components, it is possible to couple and to link a frequency control of the amplifier to the control signal of a frequency locked loop, which includes the VCO.

In this way, it is also possible to automatically calibrate and to automatically tune the center frequency of the amplifier, in particular of a LNA to the respective center frequency of a VCO. In this way, a very precise and easy adaptation of the tunable parameters of the amplifier irrespective of modifications and deviations in the manufacturing process, and irrespective of temperature and supply voltage can be provided.

In a further preferred embodiment the tuning also comprises a phase locked loop (PLL) including the voltage controlled oscillator. Said PLL is further coupled with the amplifier for tuning of the amplifier center frequency. While the FLL may provide a rather coarse tuning of the center frequency of the VCO and the amplifier, the PLL may provide a fine tuning of their respective center frequencies. Typically, the FLL comprises a series of switchable capacitors that may be digitally controlled. Generally, the phase locked loop is operable to precisely force the VCO to oscillate at a given desired frequency.

The tunable LC tank circuit of the VCO may comprise a variable capacitor, hence a varicap or a voltage-controlled capacitor. Here, a tuning voltage present to the voltage-controlled capacitor of the LC tank circuit of the VCO is operable to precisely control the center frequency of the VCO. However, if a non-tuned center frequency of the VCO is very far away from a desired frequency value, then the phase locked loop will fail to operate correctly. In such cases, the frequency locked may be additionally used to digitally control the value of the capacitor of the LC tank circuit of the VCO. By means of the FLL the center frequency of the VCO can be tuned and shifted towards the locking range of the PLL. For this purpose, the FLL or ALL typically comprises at least a series of digitally adjustable capacitors.

In a further preferred embodiment, the narrow band receiver or transceiver also comprises an impedance matching circuit coupled with the frequency locked loop. In this way not only the amplifier but also the impedance matching circuit can be tuned and adjusted in regard of the tunable center frequency of the VCO.

Moreover and according to a further embodiment the impedance matching circuit may also be coupled with the phase locked loop of the tuning assembly or module in order to provide a fine tuning of the center frequency of the impedance matching circuit.

Consequently, the tuning assembly featuring up to three different control loops, namely an ALL, FLL and a PLL may be operable to tune the impedance matching circuit, the amplifier and the VCO simultaneously in regard of their center frequency and in regard to amplifier gain and the VCO's voltage swing.

In a further preferred embodiment the amplifier comprises a low-noise amplifier LNA comprising an LC tank circuit for tuning of the amplifier's center frequency. By means of the LC tank circuit or resonator circuit of the amplifier, its center frequency can be effectively adjusted by tuning and electronically adjusting the capacitance of the LC tank circuit.

According to another embodiment, also the voltage-controlled oscillator comprises an LC tank circuit for tuning of the oscillator's center frequency. The LC tank circuit of the VCO typically comprises an inductor, a digitally switchable array of capacitors as well as a voltage-controlled capacitor. By means of the switchable array of capacitors of the FLL, the center frequency or resonance frequency of the respective VCO LC tank circuit can be at least coarsely adjusted. The voltage-controlled capacitor of the VCO's LC tank circuit is particularly adapted to interact with the PLL in order to provide a fine tuning of the VCO's center frequency.

According to another embodiment the electronic components of the amplifier's LC tank circuit and the electronic components of the oscillator's LC tank circuit comprise a substantially identical design or structure. In particular, the capacitors of LC tank circuits of the amplifier and the oscillator are of substantially identical type. For instance, the inductors and/or the capacitors of the LC tank circuits are at least structurally similar or structurally identical.

For instance, the capacitors of the LC tank circuits comprise film capacitors, ceramic capacitors or electrolytic capacitors. In an integrated circuit, capacitors with metal to metal, metal fringe or poly-silicon to poly-silicon capacitance can be used. Here, the capacitors of the LC tank circuits may for instance comprise thin plastic films which are either metalized by applying a metal film directly to the surface of the plastic film. In other configurations the capacitors of at least both LC tank circuits may for instance comprise a thin plastic film provided with a separate metallic foil attached thereto.

In a similar way also the inductive components of the LC tank circuits of the amplifier and the VCO are of similar or identical structure. It is preferably intended, that the electronic components, in particular the capacitors and/or the inductors used in LC tank circuits of the amplifier and VCO, respectively, are made of the same materials. In this way, the response of respective LC tank circuits of the amplifier and the VCO may become highly similar with respect to changes of the surrounding temperature as well as with respect to manufacturing tolerances.

In a further embodiment, the amplifier's and the oscillator's LC tank circuits are simultaneously tunable by means of the frequency locked loop and/or by means of the phase locked loop of the tuning assembly or module. Here, the FLL and/or the PLL provided by the tuning module may serve to simultaneously tune the center frequency or resonance frequency of both, the amplifier and the VCO.

In a further preferred embodiment, the amplifier and the voltage controlled oscillator are provided in a common integrated circuit (IC). Consequently, the amplifier and the VCO are provided as components of a single integrated circuit. By integrating the amplifier and the VCO in a common IC, variations regarding electronic components of respective LC tank circuits can be kept at a moderate level. Typically, the deviation or variance between the capacitors and/or inductors of LC tanks of the amplifier and the VCO may be in the range of less than 5%, preferably less than 2%. Typically, the mismatch of the electronic components of an IC may be around or less than 1%.

According to a further embodiment, the amplifier, preferably in form of a LNA comprises a bias generator for tuning the amplifier's gain. Typically, the gain of a LNA is proportional to the quality factor Q of its LC tank circuit and is further proportional to the current. Preferably, the bias generator is connected to an active amplifying element of the amplifier. By means of the bias generator, the voltage and/or current provided to the amplifying element can be modified in order to adjust and to tune the current within the amplifier.

In a similar way and according to another embodiment also the voltage controlled oscillator comprises a bias generator, such as a bias current generator for tuning the oscillator's output amplitude, in particular for tuning the oscillator's voltage swing. Similar and as described above with respect to the gain of the amplifier, the oscillator's output amplitude is proportional to a bias current and proportional to the quality factor Q of its LC tank circuit. Since the LC tank circuits of the VCO and the amplifier are structurally identical or similar, the respective quality factors Q of the amplifier and the VCO are substantially identical.

In this way, the gain of the amplifier and the voltage swing of the VCO behave highly similar. Therefore, the signals obtained from the ALL and the signals obtained from the FLL and/or PLL for driving and tuning the VCO can be accordingly applied to the amplifier, in particular to the LNA.

Therefore, and according to another preferred embodiment, the amplifier's and the oscillator's bias generators are simultaneously tunable by means of the amplitude locked loop of the tuning module.

In still another aspect the invention also relates to a method of tuning an amplifier of a narrow band receiver or transceiver as described above. The method comprises the step of tuning an output amplitude of a voltage-controlled oscillator by means of at least one control loop. Said control loop is further coupled to at least a gain control of the amplifier thereby allowing to simultaneously tune the amplifier's gain and the oscillator's output amplitude with a compensation of the effect of variation on the gain of the amplifier by using an information from tuning of the output amplitude of the voltage controlled oscillator in the control loop.

In particular, the present method is operable by means of the narrow band receiver or transceiver as described above. Said present method allows calibrating the system in background. Therefore, any features, benefits and general properties of the narrow band receiver or transceiver equally apply to the method and vice versa.

BRIEF DESCRIPTION OF THE DRAWINGS

In the following, a preferred embodiment of the invention will be described by making reference to the drawings, in which.

DETAILED DESCRIPTION OF THE INVENTION

Figure 2:
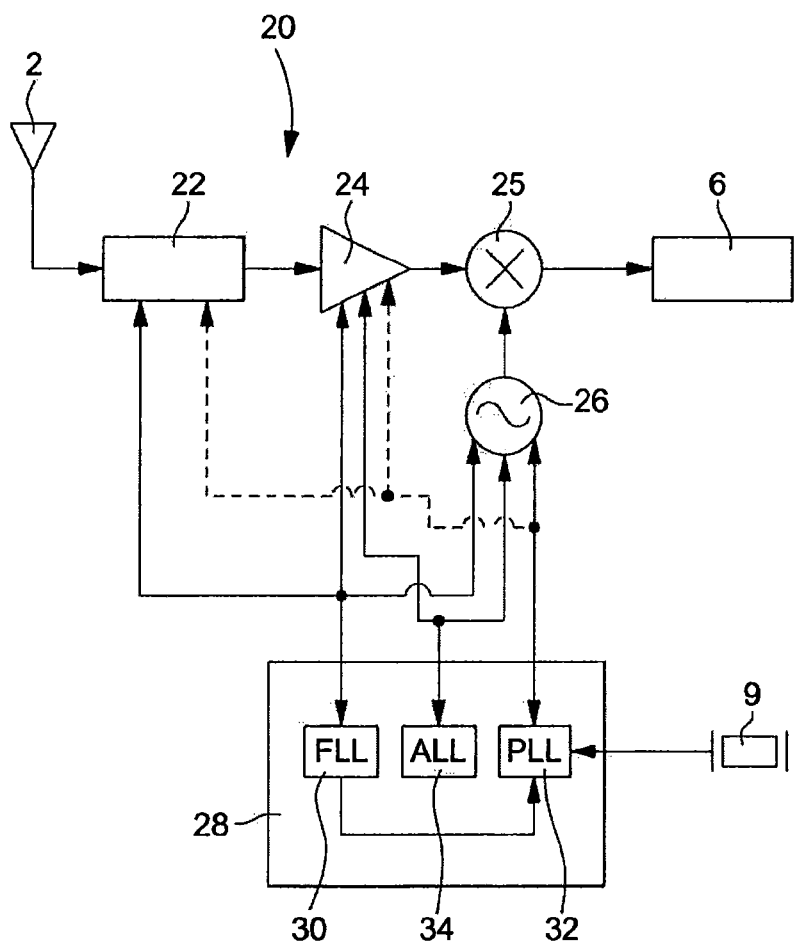
FIG. 2 is illustrative of an embodiment of a narrow band receiver according to the present invention, FIG. 3 schematically illustrates the internal structure of the amplifier and FIG. 4 schematically shows the internal structure of an LC tank circuit of a VCO.

The narrow band receiver 20 as illustrated in FIG. 2 comprises an antenna 2 which is coupled to an impedance matching circuit 22. The output of the impedance matching circuit 22 is connected to an input of the amplifier 24. The output of the amplifier 24 is coupled to a mixer 25, which is operable to provide a respective output signal to a filter and demodulator 6.

Furthermore and as it is typically implemented in a narrow band receiver 20 there is also provided a voltage-controlled oscillator (VCO) 26. The output of the VCO 26 is provided to the mixer 25.

Figure 1:
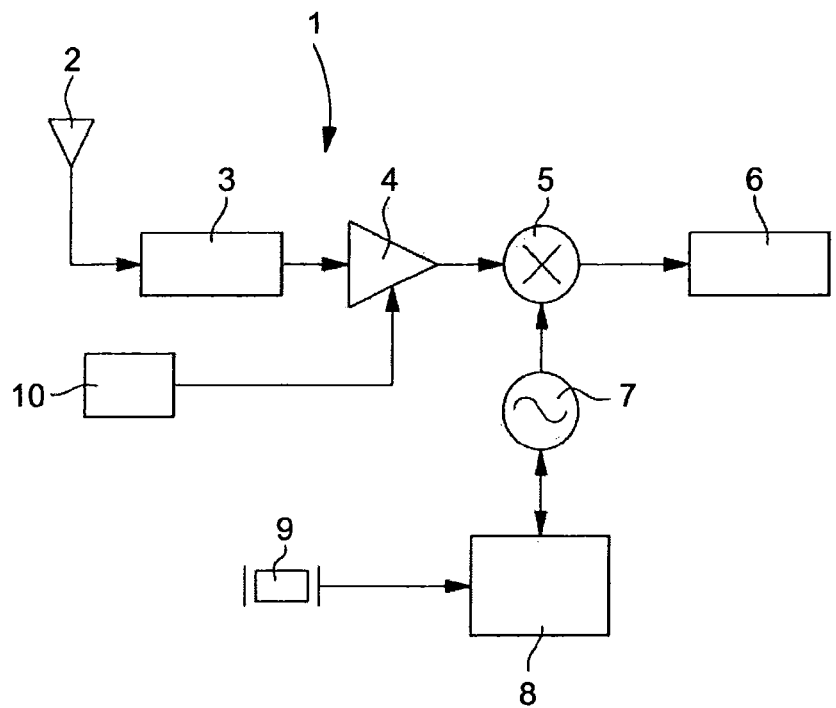
FIG. 1 already cited shows a conventional narrow band receiver according to the prior art.

Additionally to the conventional architecture as illustrated in FIG. 1 also here a reference 9, typically in form of a crystal providing a well-defined reference frequency is provided.

However, in contrast to a conventional architecture as shown in FIG. 1 the narrow band receiver 20 comprises a tuning assembly or module 28 which serves to simultaneously tune the VCO 26 and the amplifier 24. The tuning module 28 sets up a series of control loops together with the voltage-controlled oscillator 26. For tuning and adjusting the voltage swing of the VCO 26 the coupling of VCO 26 and tuning module 28 provides an amplitude locked loop (ALL).

The tuning module 28 and the VCO 26 are further coupled to establish and to provide at least a frequency locked loop (FLL) 30 and/or a phase locked loop (PLL) 32. By means of the combination of FLL 30 and PLL 32 the center frequency of the VCO 26 can be driven to a desired and predefined center frequency. Here, the FLL 30 provides a coarse tuning while the PLL 32 provides a fine tuning of the center frequency of the VCO 26.

In particular, interaction the tuning module 28 with the VCO 26 sets up the various control loops 30, 32, 34.

As further illustrated in FIG. 2 the FLL 30 of the tuning module 28 is further coupled with the impedance matching circuit 22. In this way, the center frequency of the impedance matching circuit 22 can be adjusted in accordance with the tuning of the VCO 26. The PLL 32 of the tuning module 28 can be optionally connected to In a similar way also the center frequency of the amplifier, typically implemented as LNA 24 can be adjusted.

The PLL 32 of the tuning module 28 can be optionally connected to the impedance matching circuit 22 and to the LNA 24 in order to finely tune the center frequency in the impedance matching circuit 22 and the LNA 24.

As indicated in FIG. 2 the FLL 30 is also coupled with the amplifier 24. Additionally, also the signal of the ALL 34 can be provided to the amplifier 24. The coupling with the ALL 34 provides a tuning of the amplifier's gain 24 whereas the coupling between the amplifier 24 and the FLL 30 provides a coarse tuning of the center frequency of the amplifier 24. The VCO 26, which sets up the FLL 30, the PLL 32 and ALL 34 is naturally coupled with all three control loops 30, 32, 34.

Figure 3:
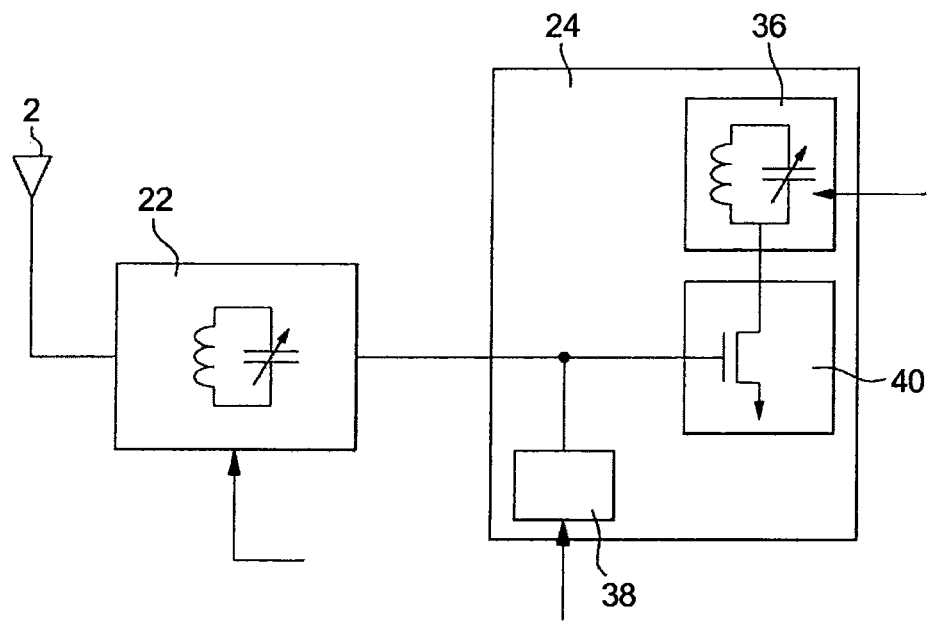
Figure 4:
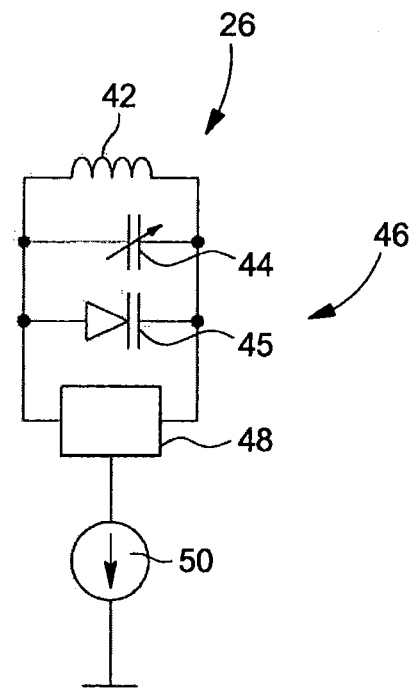

By means of coupling the LNA 24 with the ALL 34 and with the FLL 30, a simultaneous tuning of LNA 24 and VCO 26 can be obtained. Preferably, the tuning circuit, hence the LC tank circuits 36, 46 as indicated in FIGS. 3 and 4 of amplifier 24 and VCO 26 are of a similar or identical structure. Therefore, the temperature response and the general behaviour of the amplifier 24 and the VCO 26 with regard to manufacturing tolerances are highly similar. By driving the amplifier 24 with tuning signals obtained from a VCO-base ALL 34 and FLL 30 an automatic frequency and an automatic gain control of the LNA 24 can be obtained.

In FIG. 3 the internal structure of the amplifier 24 is shown. The amplifier 24 comprises an LC tank circuit 36 featuring at least one inductor and at least one tunable capacitor. Moreover, the amplifier 24 comprises an active amplifier circuit 40 which is driven and tunable by a bias generator 38. The input of the bias generator 38 is connectable to the ALL 34 of the tuning module 28. In this way, the voltage and/or current applied to the gate of the amplifier circuit 40 can be tuned and adjusted in order to appropriately modify the current and hence the gain of the amplifier circuit 40 and hence of the entire amplifier 24.

As further illustrated in FIG. 3 the LC tank circuit 36 of the amplifier 24 can be connected to the FLL 30 of the tuning module 28. In this way, a center frequency of the amplifier 24 can be adjusted in accordance with a respective adjustment and tuning of the VCO 26.

The internal structure of the VCO 26 is schematically illustrated in FIG. 4. The VCO 26 also comprises an LC tank circuit 46 having at least one inductor 42, a switchable array of capacitors 44 and at least one voltage-controlled capacitor 45. The inductor 42, the capacitor array 44 and the voltage controlled-capacitor 45 are arranged in parallel.

Furthermore, the LC tank circuit 46 of the VCO 26 also comprises an active element 48 which is operable to compensate inevitable losses of the LC arrangement. Additionally, the VCO 26 comprises a bias generator 50 by way of which the output amplitude of the VCO 26 can be adjusted to a predefined level.

The bias generator 50 is preferably driven and coupled by the amplitude locked loop 34. The frequency locked loop 30 is preferably coupled with the switchable capacitor array 44. By means of the FLL 30 the center frequency of the VCO 26 can be at least coarsely adjusted, e.g. by digitally controlling the number and type of capacitors of the capacitor array 44 being active in the LC tank circuit 26. The voltage-controlled capacitor 45 is preferably coupled or integrated into the PLL 32 in order to provide a fine tuning of the center frequency of the VCO.

Even though not particularly illustrated it is also conceivable, that also the amplifier 24 as well as the impedance matching circuit 22 are coupled with the PLL 32. In this case the PLL 32 can finely tune the center frequency in the impedance matching circuit and the narrow band amplifier.

In effect, the gain and the frequency of the amplifier 24 can be automatically controlled by the tuning module 28 and by the control loop 30, 32, 34 thereof being implemented by means of the VCO 26.

It is to be noted that a narrow band amplifier for amplifying signals to be transmitted in a narrow band transceiver can be tuned by the tuning assembly according to the tuning of the VCO. In the narrow band transceiver not shown, it can be provided an A/D converter for sampling the RF signals to be transmitted without passing through the mixer. The narrow band amplifier can amplify the signals provided after the A/D converter and with an amplifier's gain control and center frequency tuning obtained by the tuning module coupled to the VCO.

What is claimed is:

1. A narrow band receiver or transceiver for processing of electrical signals, comprising:
    at least one amplifier for amplifying received signals or signals to be transmitted,
    a voltage controlled oscillator, and
    a tuning assembly or module comprising at least one control loop for tuning the voltage controlled oscillator,
    wherein at least a gain control of the amplifier is coupled to the at least one control loop, which is an amplitude locked loop including the voltage controlled oscillator, for simultaneously tuning the output amplitude of the voltage controlled oscillator and the gain of the amplifier with a compensation of the effect of variation on the gain of the amplifier, which includes an LC tank circuit, by using an information in another LC tank circuit of the voltage controlled oscillator for tuning of the output amplitude of the voltage controlled oscillator in the control loop.

2. The narrow band receiver or transceiver according to claim 1, wherein the tuning assembly comprises a frequency locked loop including the voltage controlled oscillator and wherein said frequency locked loop is coupled with the amplifier for tuning of the amplifier's center frequency.

3. The narrow band receiver or transceiver according to claim 1, wherein the tuning assembly comprises a phase locked loop including the voltage controlled oscillator, and wherein said phase locked loop is coupled with the amplifier for tuning of the amplifier's center frequency.

4. The narrow band receiver or transceiver according to claim 2, further comprising an impedance matching circuit coupled with the frequency locked loop.

5. The narrow band receiver or transceiver according to claim 4, wherein the impedance matching circuit is coupled with a phase locked loop including the voltage controlled oscillator.

6. The narrow band receiver or transceiver according to claim 1, wherein the amplifier comprises a low-noise amplifier comprising an LC tank circuit for tuning of the amplifier's center frequency.

7. The narrow band receiver or transceiver according to claim 6, wherein the voltage controlled oscillator comprises an LC tank circuit for tuning of the oscillator's center frequency.

8. The narrow band receiver or transceiver according to claim 7, wherein electronic components of the amplifier's LC tank circuit and electronic components of the oscillator's LC tank circuit comprise a substantially identical design or structure.

9. The narrow band receiver or transceiver according to claim 8, wherein the amplifier's and the oscillator's LC tank circuits are simultaneously tunable by means of the frequency locked loop and/or by means of the phase locked loop of the tuning assembly.

10. The narrow band receiver or transceiver according to claim 1, wherein the amplifier and the voltage controlled oscillator are components of a common integrated circuit.

11. The narrow band receiver or transceiver according to claim 1, wherein the amplifier comprises a bias generator for tuning of the amplifier's gain.

12. The narrow band receiver or transceiver according to claim 11, wherein the voltage controlled oscillator comprises a bias generator for tuning of the oscillator's output amplitude.

13. The narrow band receiver or transceiver according to claim 12, wherein amplifier's and the oscillator's bias current generators are simultaneously tunable by means of the amplitude locked loop of the tuning assembly.

14. A method of tuning an amplifier of a narrow band receiver or transceiver, the method comprising the steps of:
    tuning of an output amplitude of a voltage-controlled oscillator by means of at least one control loop of a tuning assembly,
    coupling of the control loop, which is an amplitude locked loop including the voltage controlled oscillator, to a gain control of the amplifier to simultaneously tune the voltage gain of the amplifier and the oscillator's output amplitude with a compensation of the effect of variation on the gain of the amplifier, which includes an LC tank circuit, by using an information in another LC tank circuit of the voltage controlled oscillator for tuning of the output amplitude of the voltage controlled oscillator in the control loop.

15. A narrow band receiver or transceiver for processing of electrical signals, comprising:
    at least one amplifier for amplifying received signals or signals to be transmitted,
    a voltage controlled oscillator, and
    a tuning assembly or module comprising at least one control loop for tuning the voltage controlled oscillator,
    wherein at least a gain control of the at least one amplifier is coupled to the at least one control loop for simultaneously tuning the output amplitude of the voltage controlled oscillator and the gain of the at least one amplifier with a compensation of the effect of variation on the gain of the at least one amplifier by using an information from tuning of the output amplitude of the voltage controlled oscillator in the control loop, and
    wherein the tuning assembly comprises a frequency locked loop including the voltage controlled oscillator and wherein said frequency locked loop is coupled with the at least one amplifier for tuning of the amplifier's center frequency.

16. The narrow band receiver or transceiver according to claim 15, further comprising an impedance matching circuit coupled with the frequency locked loop.

17. The narrow band receiver or transceiver according to claim 16, wherein the impedance matching circuit is coupled with a phase locked loop including the voltage controlled oscillator.

18. A narrow band receiver or transceiver for processing of electrical signals, comprising:
    at least one amplifier for amplifying received signals or signals to be transmitted,
    a voltage controlled oscillator, and
    a tuning assembly or module comprising at least one control loop for tuning the voltage controlled oscillator,
    wherein at least a gain control of the at least one amplifier is coupled to the at least one control loop for simultaneously tuning the output amplitude of the voltage controlled oscillator and the gain of the at least one amplifier with a compensation of the effect of variation on the gain of the at least one amplifier by using an information from tuning of the output amplitude of the voltage controlled oscillator in the control loop, and
    wherein the tuning assembly comprises a phase locked loop including the voltage controlled oscillator, and wherein said phase locked loop is coupled with the at least one amplifier for tuning of the amplifier's center frequency.

* * * * *